(12) United States Patent
Guo et al.

(10) Patent No.: US 7,971,317 B2
(45) Date of Patent: Jul. 5, 2011

(54) HINGE ASSEMBLY AND PORTABLE ELECTRONIC DEVICE USING THE SAME

(75) Inventors: Shi-Kun Guo, Shenzhen (CN); Jin-Feng Liu, Shenzhen (CN); Qia-Kai Xie, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 364 days.

(21) Appl. No.: 12/187,403

(22) Filed: Aug. 7, 2008

(65) Prior Publication Data

US 2009/0205168 A1   Aug. 20, 2009

(30) Foreign Application Priority Data

Feb. 20, 2008  (CN) .......................... 2008 1 0300358

(51) Int. Cl.
    *E05F 1/08*  (2006.01)
(52) U.S. Cl. ................. 16/307; 16/262; 16/297; 16/357
(58) Field of Classification Search .................... 16/297, 16/289, 307, 308, 306, 256, 270, 257, 263, 16/262; 379/433.12, 433.13; 361/679, 680–683; 720/655, 694, 638, 612; 206/307, 308.1, 206/309–311; 220/845, 847, 848, 837, 842, 220/4.22
See application file for complete search history.

(56) References Cited

U.S. PATENT DOCUMENTS

| | | | | |
|---|---|---|---|---|
| 2,557,048 A * | 6/1951 | Haase | ........................... | 220/830 |
| 3,231,927 A * | 2/1966 | Ammon | .......................... | 16/331 |
| 4,069,548 A * | 1/1978 | Bierlich | .......................... | 16/341 |
| 4,584,589 A * | 4/1986 | Bivins et al. | ................... | 343/882 |
| 4,882,807 A * | 11/1989 | Frye et al. | ........................ | 16/225 |
| 5,052,076 A * | 10/1991 | Spaeth | ............................ | 16/266 |
| 6,231,021 B1 * | 5/2001 | Hong | ............................. | 248/371 |
| 6,868,547 B1 * | 3/2005 | Srikumar | ........................ | 720/655 |
| 7,013,530 B2 * | 3/2006 | Lallemant | ....................... | 16/297 |
| 7,594,303 B2 * | 9/2009 | Wang et al. | .................... | 16/297 |
| 2004/0218517 A1 | 11/2004 | Yano et al. | | |
| 2005/0229195 A1 * | 10/2005 | Liu | .............................. | 720/655 |

\* cited by examiner

*Primary Examiner* — Chuck Y. Mah
(74) *Attorney, Agent, or Firm* — Frank R. Niranjan

(57) ABSTRACT

A hinge assembly and a portable electronic device are provided. The portable electronic device includes a lid, a main body, and a hinge assembly. The hinge assembly pivotly connects the lid to the main body. The hinge assembly includes a pivot element, a torsion spring, and a hinge brace. The pivot element is formed on the lid and partially and rotatably received in the main body. The torsion spring is assembled between the lid and the main body. When the lid is in a closed position with respect to the main body, the torsion spring becomes constricted and accumulates potential energy. When the lid is opened from the main body, the potential energy of the torsion spring is released to drive the lid to rotate to an open position with respect to the main body. The hinge brace is attached to the main body for blocking an excessive rotation of the lid with respect to the main body.

16 Claims, 7 Drawing Sheets

HINGE ASSEMBLY AND PORTABLE ELECTRONIC DEVICE USING THE SAME

BACKGROUND

1. Field of the Invention

The present invention generally relates to portable electronic devices, and particularly to a portable electronic device using a hinge assembly.

2. Description of Related Art

A conventional lid-type electronic device includes a main body and a lid pivotally connected to the main body via a hinge assembly. The hinge assembly is for rotatably supporting the lid relative to the main body when opening the lid from or closing the lid onto the main body. Some hinge assemblies further can automatically drive the lid to move from a closed position to an open position.

The hinge assembly includes a torsion spring having a first end and a second end. The first end is coupled to the main body, and the second end is engaged with the lid. When the lid is in the closed position, the torsion spring becomes constricted, i.e. resiliently deformed, and accumulates potential energy. When the potential energy of the torsion spring is released, the lid is driven to move from the closed position to the open position. However, if the potential energy is comparatively large, the lid may vibrate fiercely. Therefore, the lid may be damaged.

Therefore, an improved hinge assembly used in a portable electronic device is needed in the industry to address the aforementioned deficiency.

SUMMARY

A hinge assembly and a portable electronic device are provided. The portable electronic device includes a lid, a main body, and a hinge assembly. The hinge assembly pivotly connects the lid to the main body. The hinge assembly includes a pivot element, a torsion spring, and a hinge brace. The pivot element is formed on the lid and partially and rotatably received in the main body. The torsion spring is assembled between the lid and the main. When the lid is in a closed position with respect to the main body, the torsion spring becomes constricted and accumulates potential energy. When the lid is opened from the main body, the potential energy of the torsion spring is released to drive the lid to rotate to an open position with respect to the main body. The hinge brace is attached to the main body for blocking an excessive rotation of the lid with respect to the main body.

Other advantages and novel features of the present invention will become more apparent from the following detailed description of preferred embodiment when taken in conjunction with the accompanying drawings.

DETAILED DESCRIPTION

Figure 1:
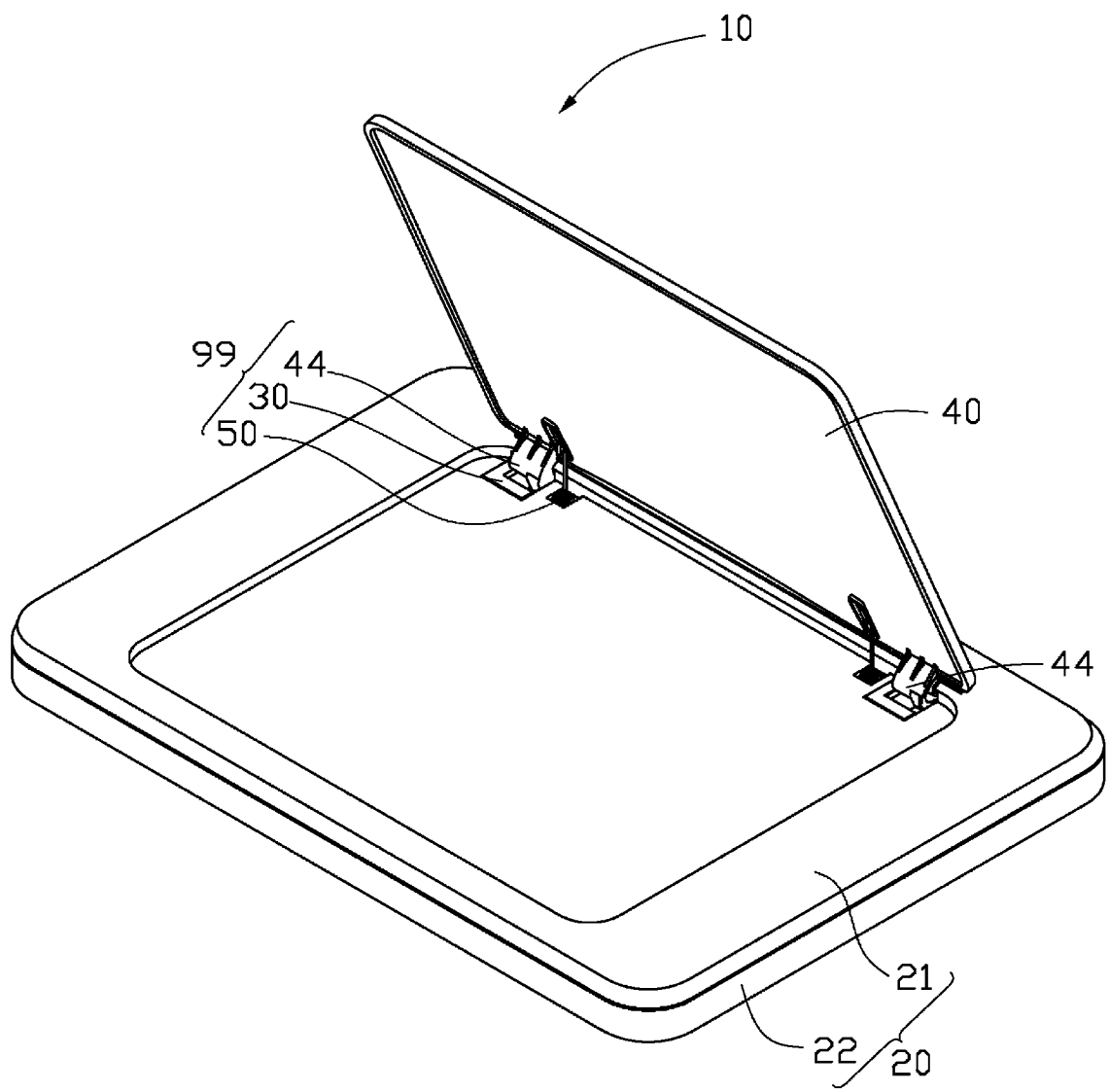
FIG. 1 is a schematic assembled diagram showing a portable electronic device in accordance with an exemplary embodiment.

Referring to FIG. 1, a portable electronic device 10 in accordance with an exemplary embodiment includes a main body 20, two hinge assemblies 99, and a lid 40. The two hinge assemblies 99 pivotally connect the lid 40 to the main body 20. Each hinge assembly 99 includes a pivot element 44, a torsion spring 50, and a hinge brace 30. The pivot element 44 is formed on the lid 40. The torsion spring 50 is assembled between the main body 20 and the lid 40. The hinge brace 30 is fixed in the main body 20. When the lid 40 is in a closed position, the lid 40 covers the main body 20, and the torsion spring 50 becomes constricted and accumulates potential energy. When the lid 40 is to be opened from the main body 20, the potential energy of the torsion spring 50 is released to drive the lid 40 to rotate to an open position. The hinge brace 30 is used for limiting an opening angle and dampening jitters of the lid 40.

Figure 2:
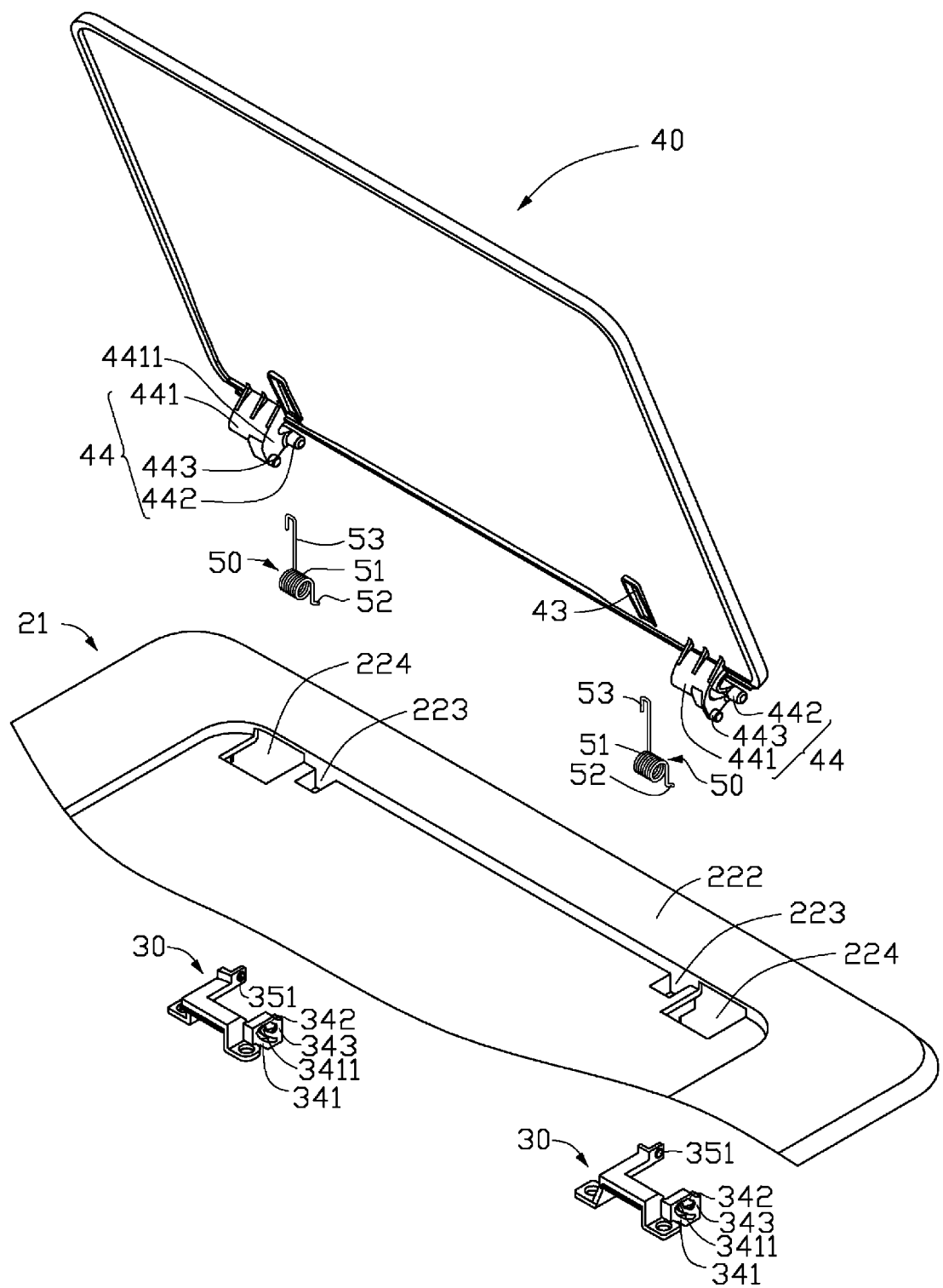
FIG. 2 is a partial exploded schematic diagram showing the portable electronic device of FIG. 1.
Figure 3:
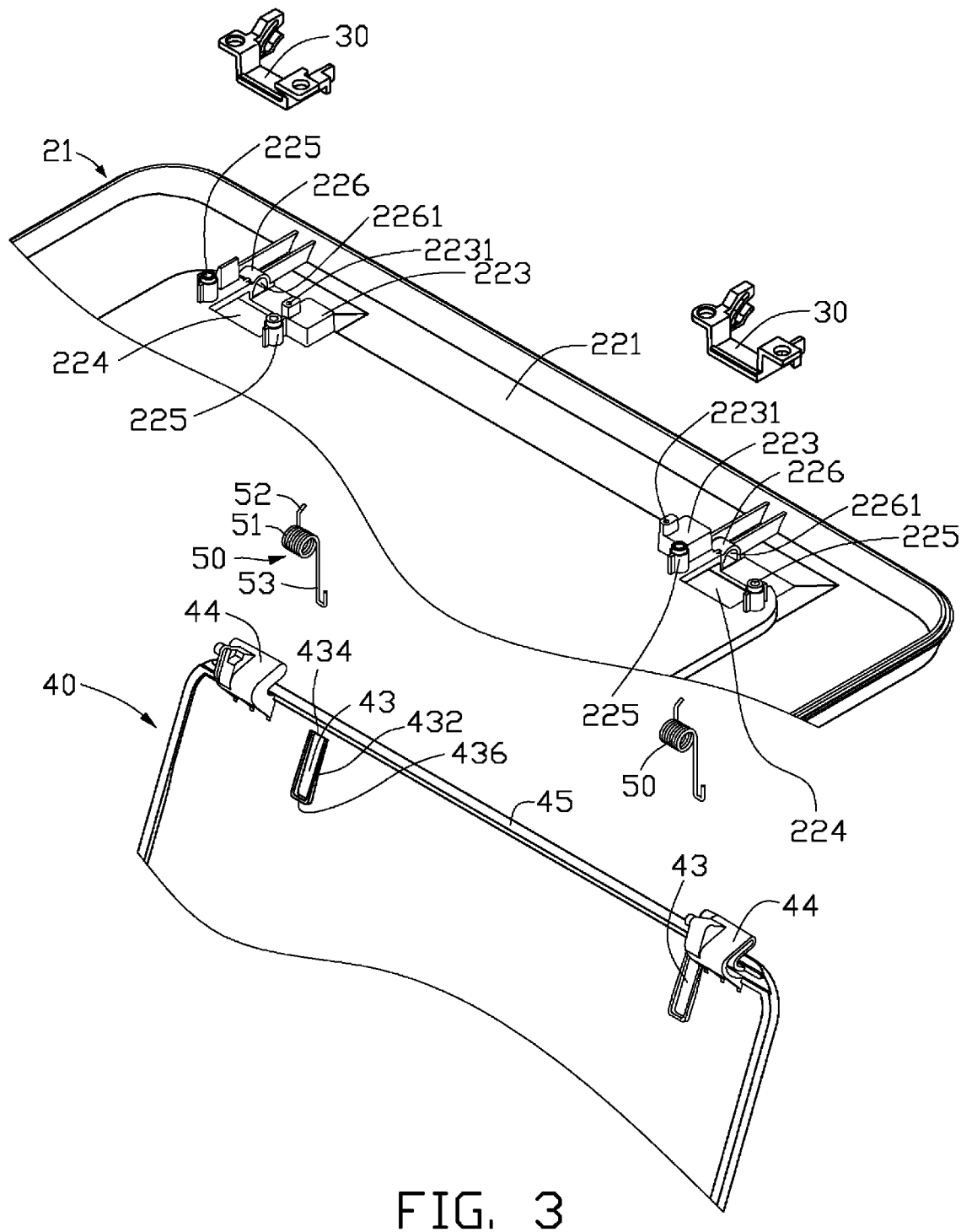
FIG. 3 is a partial exploded schematic diagram showing the portable electronic device of FIG. 2, viewing from an inversed side.

The main body 20 includes an upper cover 21 and a lower cover 22. Further referring to FIGS. 2 and 3, the upper cover 21 includes an inner surface 221 and an outer surface 222 facing the lid 40. The upper cover 21 defines two receiving depressions 223 in the outer surface 222 extending towards the inner surface 221 for receiving the torsion spring 50. A bottom of each receiving depression 223 further defines a hole 2231. The upper cover 21 also defines two openings 224 corresponding to the pivot elements 44 and forms four positioning poles 225 and two knuckles 226 corresponding to the hinge assemblies 99. Two of the four positioning poles 225 extend downwardly from the inner surface 221 of the upper cover 21 at opposite sides of one of the openings 224, and another two of the four positioning poles 225 extend downwardly from the inner surface 221 of the upper cover 21 at opposite sides of another one of the openings 224. The knuckles 226 are formed adjacent the openings 224 correspondingly. Each knuckle 226 defines a sliding slot 2261.

The lid 40 forms two wedge-shaped restriction cages 43 adjacent to the pivot elements 44 correspondingly. The restriction cage 43 consists of four sides, two longer sides on opposite sides of the restriction cage 43 and two shorter sides connecting the longer sides correspondingly. A height of the restriction cage 43 gradually increases from one of the shorter sides towards another of the shorter sides.

To more clearly describe the embodiment, only one receiving depression 223, one opening 224, two positioning poles 225, one knuckle 226, one restriction cage 43, one pivot element 44, one torsion spring 50, and one hinge brace will be detailed described hereinafter.

The restriction cage 43 is configured for restricting a portion of the torsion spring 50 from moving linearly parallel the short sides of the restriction cage 43, and for allowing the portion of the torsion spring 50 to slide linearly parallel to the longer sides of the restriction cage 43.

The pivot element 44 of the hinge assembly 99 is formed on the lid 40 near the upper cover 21. The pivot element 44 includes a connection part 441, a pivot shaft 442, and a guide shaft 443. The connection part 441 extends from the adjacent side of the lid 40 towards the opening 224. The pivot shaft 442 and the guide shaft 443 extend from one sidewall 4411 of the connection part 441, and are parallel to the lid 40.

The torsion spring 50 includes a torsion coil 51, a fixed arm 52, and a free arm 53. The fixed arm 52 and the free arm 53 extend from opposite sides of the torsion coil 51.

Figure 4:
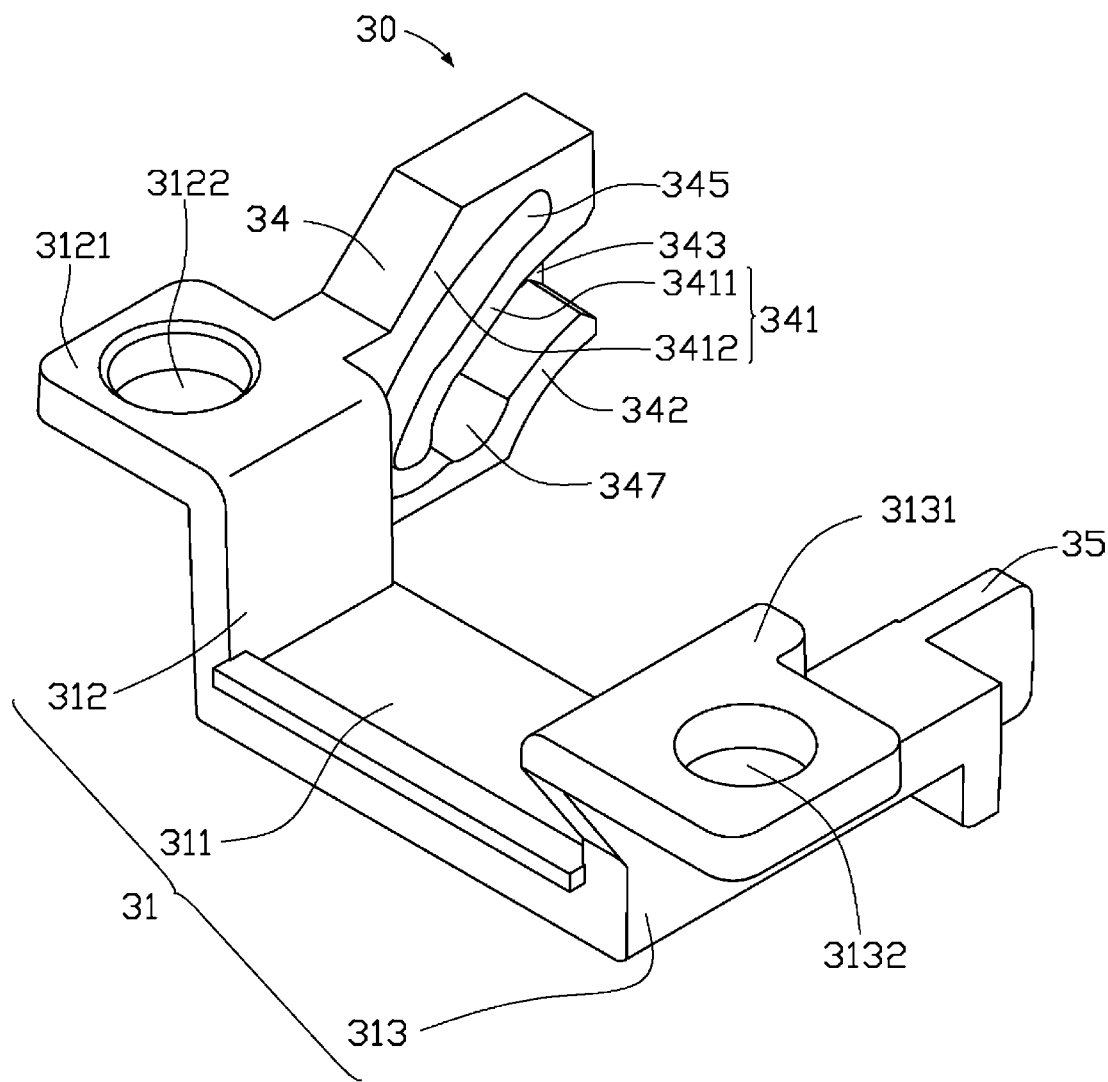
FIG. 4 is an enlarged view of a hinge brace of the portable electronic device of FIG. 3.

Also referring to FIG. 4, the hinge brace 30 includes a U-shaped bracket 31, a buffering part 34, and a blocking part 35. The buffering part 34 and the blocking part 35 extend from opposite ends of the U-shaped bracket 31 towards a same direction.

The U-shaped bracket 31 includes a rectangular base sheet 311, a first side wall 312, and a second side wall 313. The first side wall 312 and the second side wall 313 perpendicularly extend from the base sheet 311. The first side wall 312 and the second side wall 313 form a first flange 3121 and a second flange 3131 respectively. The first flange 3121 defines a first mounting hole 3122 corresponding to one of the two positioning poles 225, and the second flange 3131 defines a second mounting hole 3132 corresponding to the other one of the two positioning poles 225.

In the embodiment, screws (not shown) are adopted to mount the bracket onto the upper cover 21 via the first and second mounting holes 3121, 3122 and the positioning poles 225 correspondingly. In another embodiment, the U-shaped bracket 31 may be integrally formed with the upper cover 21.

The buffering part 34 extends from the first flange 3121, and is for providing a gradually increasing resistance at the guide shaft 443 of the pivot element 44 when the guide shaft 443 moves towards the U-shaped bracket 31. The buffering part 34 includes a first arm 341, a second arm 342, and a connection side plate 343 connecting the first arm 341 and the second arm 342. The first arm 341 first extends diagonally outwards from the U-shaped bracket 31 forming an upper sub-arm 3412, then curls back to the U-shaped bracket 31 forming a lower sub-arm 3411. The first arm 341 and the second arm 342 are substantially parallel to each other defining a buffering space 345 between them.

The lower sub-arm 3411 functions as a resilient cantilever. The lower sub-arm 3411, the second arm 342, and the connection side plate 343 defines a sliding slot 347 for allowing the guide shaft 443 to slide into the sliding slot 347. The buffering space 345 communicates with the sliding slot 347. The sliding slot 347 gradually narrows from an entrance of the sliding slot 347 to the end terminal of the sliding slot 347. A width of the end terminal is less than a diameter of the guide shaft 443.

The blocking part 35 extends from one end of the base sheet 311, and is for blocking/preventing the pivot shaft 442 of the pivot element 44 from detaching from the retaining hole 2261 of the knuckle 226. The blocking part 35 forms a protrusion 351 to push the pivot element 44 towards the knuckle 226. The protrusion 351 and the pivot shaft 442 have the same centre axis (not shown) around which the lid 40 can rotate.

Figure 5:
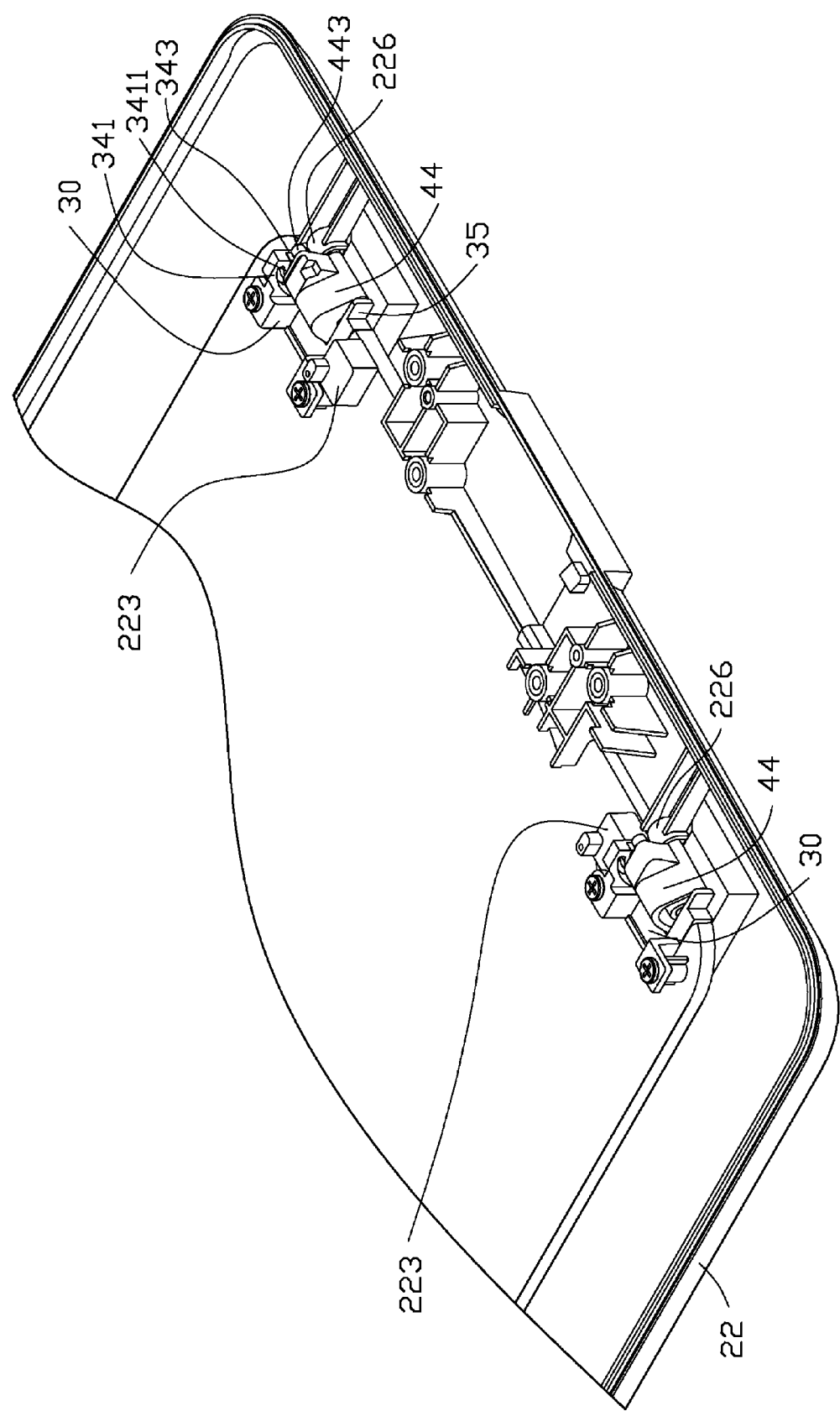
FIG. 5 is a partial disassembled, schematic diagram showing the portable electronic device when the portable electronic device is in a closed position.
Figure 6:
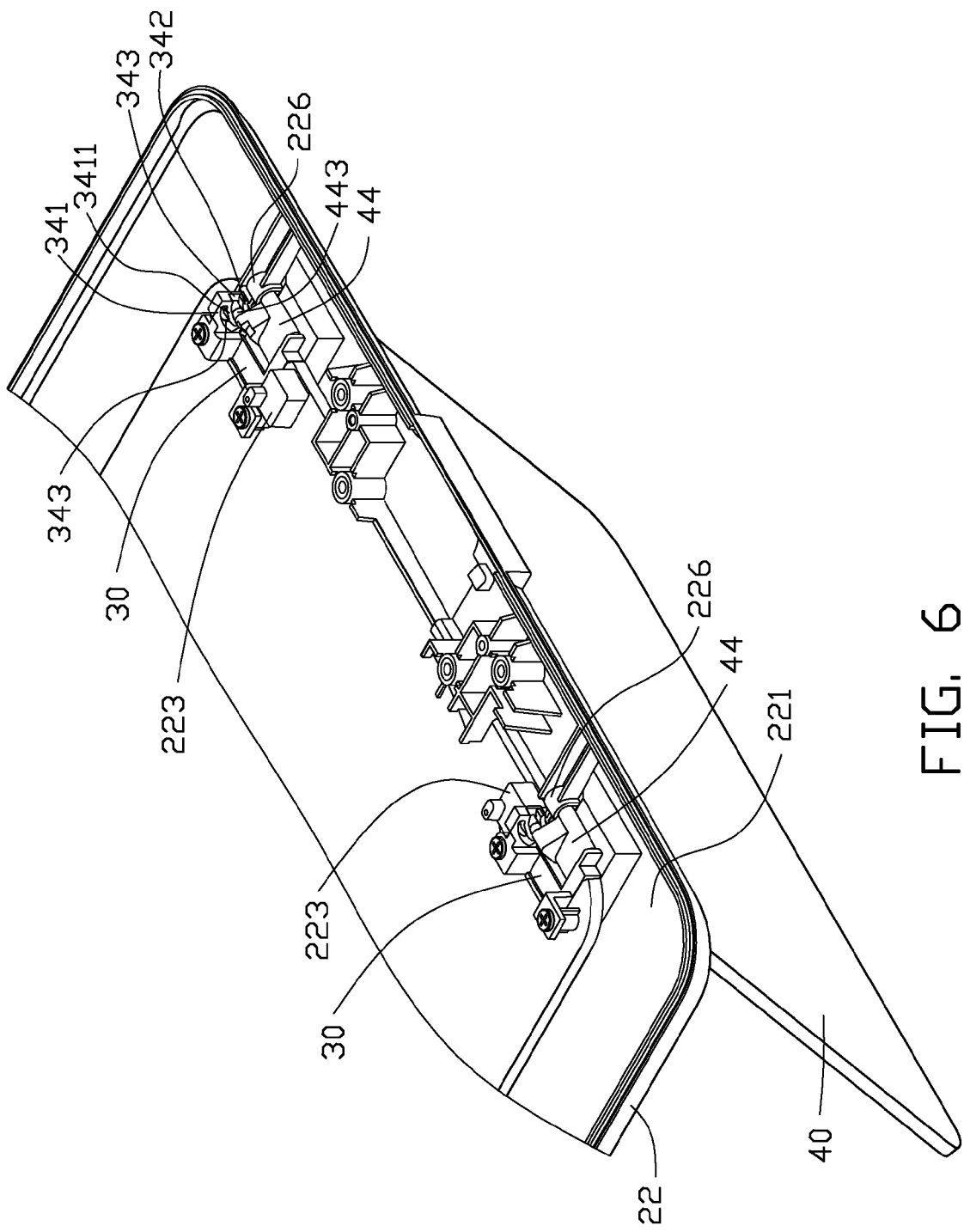
FIG. 6 is a partial disassembled, schematic diagram showing the portable electronic device when the portable electronic device is in an open position.

Also referring to FIGS. 5 and 6, in assembly, the pivot element 44 passes through the opening 224, and then moves towards the knuckle 226 to have the pivot shaft 442 rotatably received in the retaining hole 2261. The hinge brace 30 clamps the pivot element 44, with the sliding slot 347 slidably receiving the guide shaft 443 of the pivot element 44 and the protrusion 351 pushing the pivot element 44. The screws (not shown) pass through the first mounting hole 3122 and the second mounting hole 3132 of the hinge brace 30 to engage into the two positioning poles 225 respectively, so as to fix the hinge brace 30 to the upper cover 21. The fixed arm 52 of the torsion spring 50 is fixed in the fixing hole 2231, and the torsion coil 51 is received in the receiving depression 223. The restriction cage 43 slidably receives the free arm 53 of the torsion spring 50. The restriction cage 43 will restrict the free arm 53 and allow the free arm 53 to move therein.

In use, when the lid 40 is in the closed position, the torsion spring 50 becomes constricted and accumulates the potential energy. The guide shaft 443 of the pivot element 44 remains at the entrance of the sliding slot 347. When the lid 40 is opened from the main body 20, the potential energy of the torsion spring 50 is released to drive the lid 40 to rotate to the open position. The guide shaft 443 of the pivot element 44 slides from the entrance of the sliding slot 347 to the end terminal. The lower sub-arm 3411 is resiliently deformed by the guide shaft 443 towards the upper sub-arm 3412 of the first arm 341, and generates a resistance to block a successive movement of the guide shaft 443. When the lid 40 rotates from the closed position to the open position, the potential energy of the torsion spring 50 gradually diminishes, while the resistance of the lower sub-arm 3411 gradually increases. Therefore, the potential energy and the resistance when opening the lid is controlled by each other, thus limiting the vibration of the lid.

Figure 7:
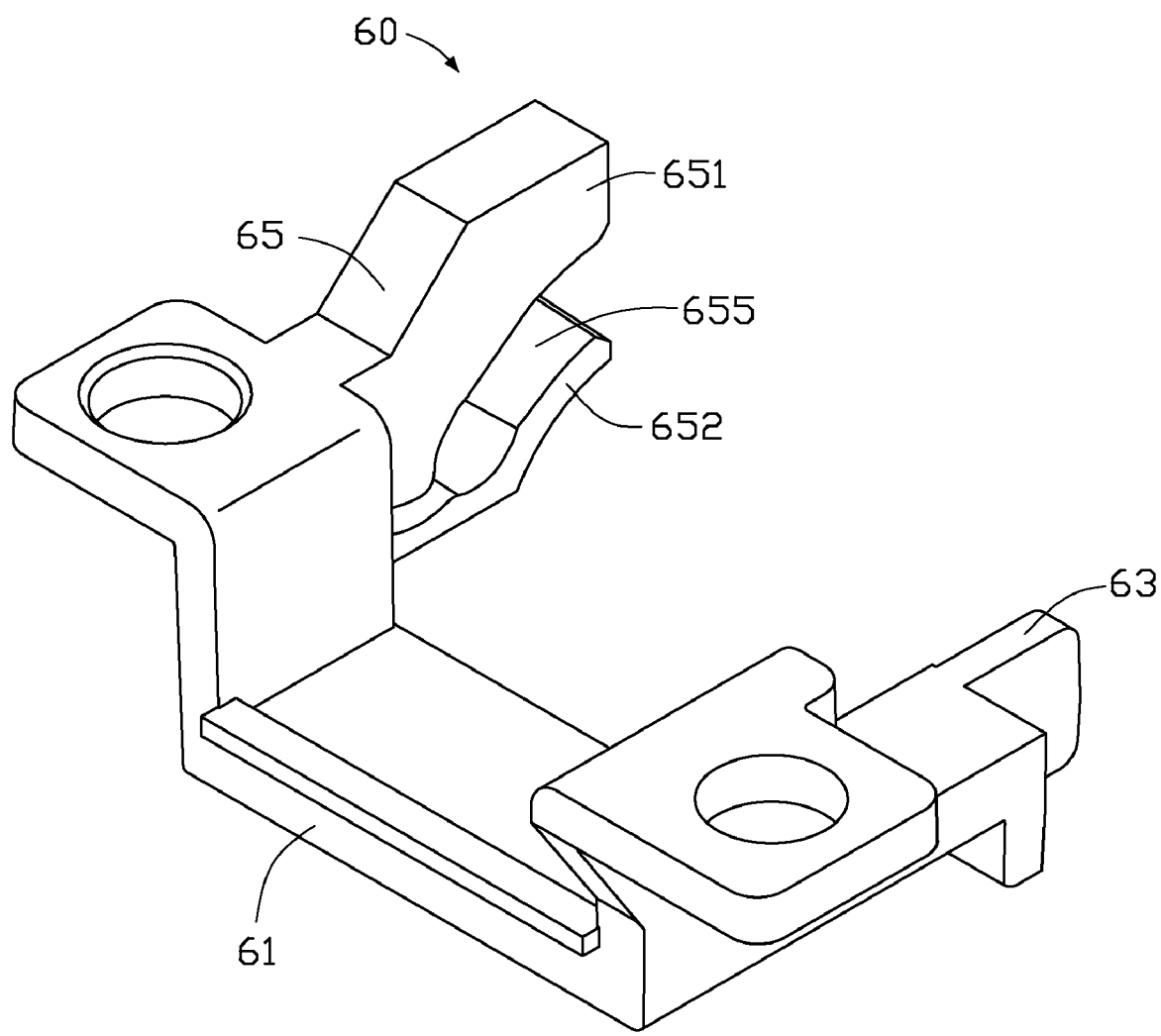
FIG. 7 is an enlarged view of a hinge brace in accordance with another exemplary embodiment.

Referring to FIG. 7, a hinge brace 60 in accordance with another exemplary embodiment is also illustrated. The hinge brace 60 includes a U-shaped bracket 61, a blocking part 63, and buffering part 65. The U-shaped bracket 61 and the blocking part 63 have same structures with the U-shaped bracket 31 and the blocking 35 respectively.

The buffering part 65 includes a first arm 651 and an second arm 652. In comparison with the first arm 341 of the buffering part 34, the first arm 651 is a substantial entity without any additional parts. The first arm 651 and the second arm 652 define a sliding slot 655 to slidably receive the guide shaft 443 (see FIG. 2). From an entrance of the sliding slot 655 to an end terminal of the sliding slot 655, the sliding slot 655 gradually gets narrow. A width of the end terminal of the sliding slot 655 is less than the diameter of the guide shaft 443 (see FIG. 2).

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A hinge assembly for pivotally connecting a first device to a second device, the hinge assembly comprising:
   a pivot element configured for being formed on the first device, and for being partially and rotatably received in the second device, the pivot element comprising a pivot shaft and a guide shaft parallel to the pivot shaft, wherein the first device is pivotally connected to the second device by the pivot shaft of the pivot element;
   a torsion spring configured for being assembled between the first device and the second device, wherein when the first device is in a closed position with respect to the second device, the torsion spring becomes constricted and accumulates potential energy, and when the first device is opened from the second device, the potential energy of the torsion spring is released to drive the first device to rotate to an open position with respect to the second device; and
   a hinge brace configured for being attached to the second device, the hinge brace defining a sliding slot for slidably receiving the guide shaft, wherein the sliding slot comprises an entrance for allowing the guide shaft sliding thereinto and an end terminal opposite to the entrance, the sliding slot gets narrow from the entrance to the end terminal such that a resistance gradually increasing is generated between the sliding slot and the guide shaft to block the movement of the guide shaft when the first device rotates from the closed position to the open position.

2. The hinge assembly according to claim 1, wherein the hinge brace comprises a U-shaped bracket configured for being fixed to the second device, a buffering part defining the sliding slot, and a blocking part, and the buffering part and the blocking part extends from the U-shaped bracket towards a first direction for clamping the pivot element.

3. The hinge assembly according to claim 2, wherein the buffering part comprises a first arm and a second arm extending from the U-shaped bracket towards the first direction, and the first arm and the second arm cooperatively define the sliding slot therebetween.

4. The hinge assembly according to claim 3, wherein the first arm firstly extends diagonally outwards from the U-shaped bracket forming an upper sub-arm, then curls back to the U-shaped bracket forming the lower sub-arm.

5. The hinge assembly according to claim 4, wherein a buffering space is defined between the upper sub-arm and the lower sub-arm.

6. The hinge assembly according to claim 5, wherein the buffering part further comprises a connection side plate connecting the first arm and the second arm, and the lower sub-arm, the second arm, and the connection side plate cooperatively define a sliding slot.

7. The hinge assembly according to claim 1, wherein a width of the end terminal is less than a diameter of the pivot shaft.

8. A portable electronic device comprising:
a lid;
a main body;
a hinge assembly pivotly connecting the lid to the main body, the hinge assembly comprising:
a pivot element formed on the lid and partially and rotatably received in the main body, the pivot element comprising a pivot shaft and a guide shaft parallel to the pivot shaft, wherein the first device is pivotally connected to the second device by the pivot shaft of the pivot element;
a torsion spring assembled between the lid and the main, wherein when the lid is in a closed position with respect to the main body, the torsion spring becomes constricted and accumulates potential energy, and when the lid is opened from the main body, the potential energy of the torsion spring is released to drive the lid to rotate to an open position with respect to the main body; and
a hinge brace attached to the main body, the hinge brace defining a sliding slot for slidably receiving the pivot shaft, wherein the sliding slot comprise an entrance for allowing the guide shaft sliding thereinto and an end terminal opposite to the entrance, the sliding slot gets narrow from the entrance to the end terminal such that a resistance gradually increasing is generated between the sliding slot and the guide shaft to block the movement of the guide shaft;
wherein when the lid rotates from the closed position to the open position, the guide shaft slides from the entrance of the sliding slot to the end terminal of the sliding slot.

9. The portable electronic device according to claim 8, wherein the main body defines an opening corresponding to the pivot element.

10. The portable electronic device according to claim 9, wherein a knuckle is formed on an inner surface of the main body and near the opening for rotatably receiving the pivot shaft.

11. The portable electronic device according to claim 10, wherein two positioning poles are formed on the inner surface of the main body and on opposite sides of the opening for positioning the hinge brace.

12. The portable electronic device according to claim 11, wherein the hinge brace comprises a U-shaped bracket fixed to the two positioning poles, a buffering part defining the sliding slot, and a blocking part, and the buffering part and the blocking part extends from the U-shaped bracket towards a first direction for clamping the pivot element.

13. The portable electronic device according to claim 12, wherein the buffering part comprises a first arm and a second arm extending from the U-shaped bracket towards the first direction, and the first arm and the second arm cooperatively define the sliding slot therebetween.

14. The portable electronic device according to claim 13, wherein the first arm firstly extends diagonally outwards from the U-shaped bracket forming an upper sub-arm, then curls back to the U-shaped bracket forming a lower sub-arm.

15. The portable electronic device according to claim 14, wherein a width of the end terminal is less than a diameter of the pivot shaft.

16. The portable electronic device according to claim 8, wherein the torsion spring comprises a torsion coil, a fixed arm, and a free arm, and a receiving depression is defined in an outer surface of the main body facing to the lid towards the inner surface to receive the torsion coil and the fixed arm, and the free arm biases the lid.

* * * * *